(12) United States Patent
Lunsman et al.

(10) Patent No.: US 10,893,630 B2
(45) Date of Patent: Jan. 12, 2021

(54) PUMPS WITH PRE-CHARGED FLUID

(71) Applicant: Hewlett Packard Enterprise Development LP, Houston, TX (US)

(72) Inventors: Harvey Lunsman, Chippewa Falls, WI (US); Steven Dean, Chippewa Falls, WI (US); Michael Scott, Chippewa Falls, WI (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 230 days.

(21) Appl. No.: 15/883,230

(22) Filed: Jan. 30, 2018

(65) Prior Publication Data
US 2019/0239387 A1    Aug. 1, 2019

(51) Int. Cl.
*H05K 7/20*        (2006.01)
*G06F 1/20*        (2006.01)

(52) U.S. Cl.
CPC ......... *H05K 7/20272* (2013.01); *G06F 1/206* (2013.01); *H05K 7/20281* (2013.01); *F28F 2250/08* (2013.01); *G06F 2200/201* (2013.01)

(58) Field of Classification Search
CPC ............ F28F 2250/08; H05K 7/20272; H05K 7/20281; G06F 1/206; G06F 2200/201
USPC ...................... 417/540; 361/679.53
See application file for complete search history.

(56) References Cited

U.S. PATENT DOCUMENTS

| | | | | |
|---|---|---|---|---|
| 4,246,923 A * | 1/1981 | Dayet | ...................... | F15B 1/02 137/116.3 |
| 4,640,534 A * | 2/1987 | Hoskins | ................ | F16L 37/088 285/143.1 |
| 6,354,819 B1 * | 3/2002 | Parikh | ...................... | F04B 9/02 137/454.4 |
| 6,741,464 B2 * | 5/2004 | Kitano | .................... | G06F 1/203 165/104.33 |
| 7,355,852 B2 | 4/2008 | Pfahnl et al. | | |
| 7,701,714 B2 | 4/2010 | Shabany | | |
| 8,303,267 B2 * | 11/2012 | Nitta | ...................... | G06F 1/203 361/679.53 |
| 8,820,351 B1 | 9/2014 | Harrington et al. | | |
| 9,668,382 B2 | 5/2017 | Steinke et al. | | |
| 9,811,127 B2 | 11/2017 | Dean et al. | | |
| 2005/0116535 A1 * | 6/2005 | Paulsen | .................. | B60T 11/06 303/87 |
| 2016/0128238 A1 | 5/2016 | Shedd et al. | | |

* cited by examiner

*Primary Examiner* — Connor J Tremarche
(74) *Attorney, Agent, or Firm* — Brooks, Cameron & Huebsch, PLLC

(57) ABSTRACT

Example implementations relate to pumps with pre-charged fluid. In some examples, a pump may comprise a first valve connected to an inlet of the pump by a first clip, a second valve connected to an outlet of the pump by a second clip, and a compression release mechanism to relieve compression forces generated on a fluid included in the pump in response to the pump being connected to a manifold, where the pump is pre-charged with the fluid.

17 Claims, 8 Drawing Sheets

PUMPS WITH PRE-CHARGED FLUID

BACKGROUND

A computing device can utilize liquid cooling to remove heat from components of a computing device. For example, components of a computing device may generate heat while in use. The components may be cooled utilizing a liquid, such as a heat transfer fluid, as a heat transfer mechanism.

Cooling computing device components using fluid can include moving fluid through the computing device via a transport mechanism such as a piping system to reach heat generating components. Moving the fluid through the computing device may be accomplished using pumps.

DETAILED DESCRIPTION

Liquid cooling can be utilized to remove heat generated by components of a computing device. As used herein, the term "liquid cooling" can, for example, refer to a method of heat removal from components of a computing device. As used herein, the term "computing device" can, for example, refer to a laptop computer, a desktop computer, a server, storage and/or networking equipment, among other types of computing devices. Components of a computing device can include, for instance, a processor, graphics card, power supply, and/or any other heat generating component of a computing device.

A pump may be utilized to cause fluid used in a liquid cooling system to be distributed to and/or from the various heat generating components of a computing device. As used herein, the term "pump" can, for example, refer to a device that moves fluid by a mechanical action.

For example, a pump may cause fluid to be distributed to a heat generating component of a computing device. The fluid can absorb heat generated by the computing device component and be pumped back out of the computing device, where the fluid can be cooled before being pumped back into the computing device.

In some examples, a pump may malfunction or fail. In such an example, a computing device may have to be disassembled in order to access the pump for servicing or replacement. Removing the pump can cause the cooling system to become unpressurized, resulting in the cooling system having to be re-pressurized once the pump is serviced or replaced. In a pressurized system with multiple pumps, the entire cooling system may be shut down to replace a particular malfunctioning or failed pump.

In some implementations, pumps with pre-charged fluid can allow for servicing and/or replacement of a pump without depressurizing and/or shutting down the cooling system. The pumps may be disconnected from the cooling system while the cooling system is functioning. The pumps may be connected to the cooling system with fluid pre-charged so that the cooling system remains under pressure, preventing the pump from having to be primed when connected to the cooling system.

Figure 1:
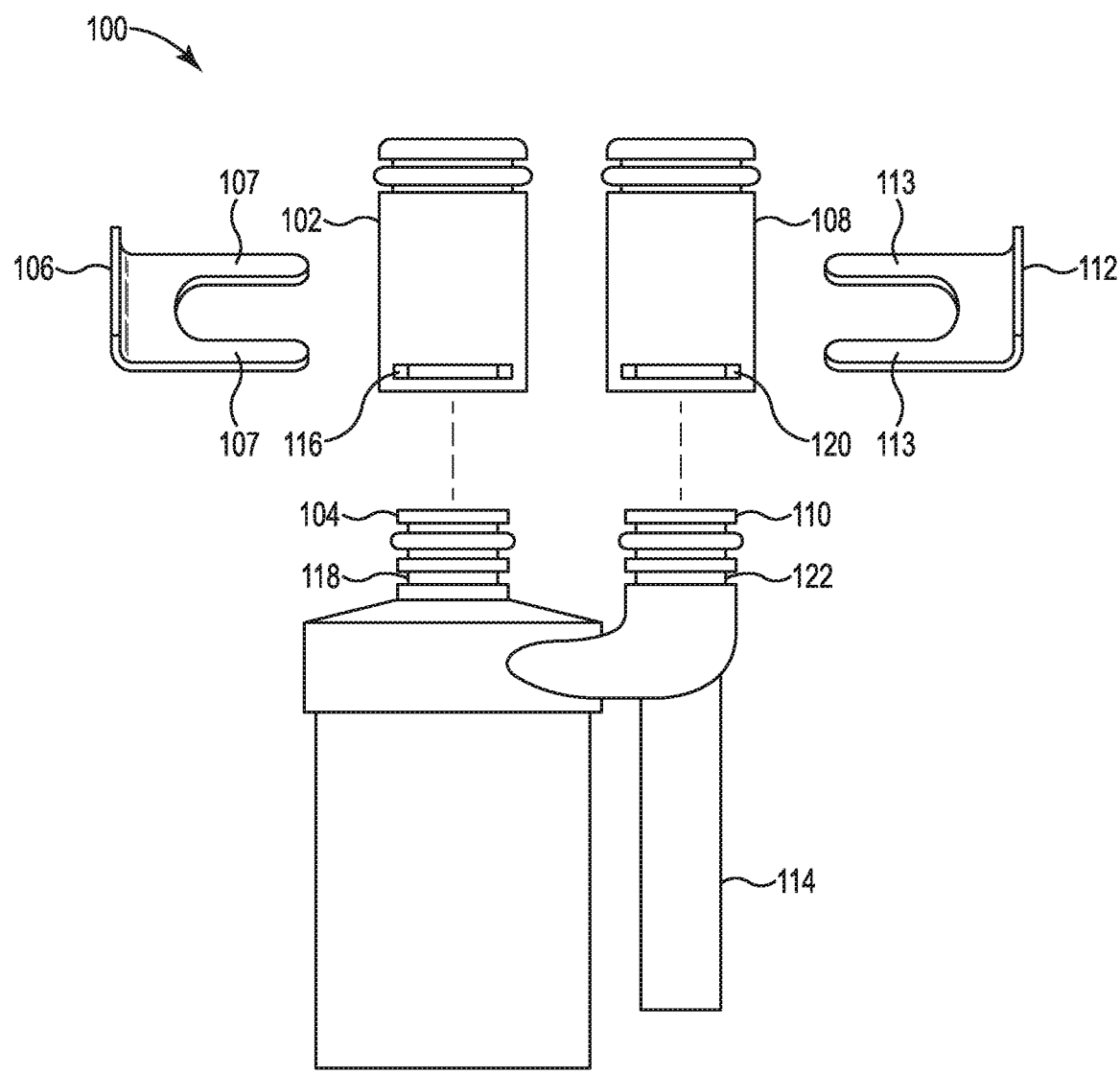
FIG. 1 illustrates a side view of an example of a pump consistent with the disclosure.

FIG. 1 illustrates a side view 100 of an example of a pump consistent with the disclosure. As illustrated in FIG. 1, the pump may include a first valve 102, inlet 104 of the pump, first clip 106, second valve 108, outlet 110 of the pump, second clip 112, and compression release mechanism 114. First valve 102 can include slot 116 and second valve 108 can include slot 120. Inlet 104 of the pump can include groove 118 and outlet 110 of the pump can include groove 122.

As illustrated in FIG. 1, the pump can include first valve 102. As used herein, the term "valve" can, for example, refer to a device that regulates, directs, and/or controls a flow of fluid by opening, closing, and/or partially obstructing a passageway of the fluid. For example, first valve 102 can regulate, direct, and/or control a flow of fluid through first valve 102.

As used herein, the term "fluid" can, for example, refer to a fluid having properties suitable for heat transfer such that the fluid can cool components of a computing device. Examples of a fluid for cooling components of a computing device can include propylene glycol, water, glycol/water solutions, and/or any other fluids suitable for heat transfer.

First valve 102 can be connected to inlet 104 of the pump. For example, first valve 102 can regulate, direct, and/or control a flow of fluid to inlet 104 of the pump.

First valve 102 can be connected to inlet 104 of the pump by first clip 106. As used herein, the term "clip" can, for example, refer to a fastening device used to connect two pieces of material. As illustrated in FIG. 1, inlet 104 of the pump can include groove 118. As used herein, the term "groove" can, for example, refer to a cut or indentation in a surface to receive a piece of material. First clip 106 can be received by groove 118 of the inlet 104 of the pump via slot 116 of first valve 102. As used herein, the term "slot" can, for example, refer to an opening in a piece of material.

For example, first valve 102 can slide over inlet 104 of the pump. Slot 116 can align with groove 118 such that prongs 107 of first clip 106 can be received by groove 118 via slot 116 in order to secure first valve 102 to inlet 104 of the pump. As used herein, the term "prong" can, for example, refer to a projecting piece of material. For example, first clip 106 can include two projecting prongs 107. When secured, prongs 107 of first clip 106 are received by groove 118 such that first clip 106 can prevent movement of first valve 102 when first valve 102 is connected to inlet 104 of the pump.

Second valve 108 can be connected to outlet 110 of the pump by second clip 112. As illustrated in FIG. 1, outlet 110 of the pump can include groove 122. Similar to first valve 102, second clip 112 can be received by groove 122 of the outlet 110 of the pump via slot 120 of second valve 108.

For example, second valve 108 can slide over outlet 110 of the pump. Slot 120 can align with groove 122 such that prongs 113 of second clip 112 can be received by groove 1122 via slot 120 in order to secure second valve 108 to outlet 110 of the pump. When secured, prongs 113 of second clip 112 are received by groove 122 such that second clip 112 can prevent movement of second valve 108 when second valve 108 is connected to outlet 110 of the pump.

The pump can include pre-charged fluid. As used herein, the term "pre-charged" can, for example, refer to a pump having cooling fluid pre-filled such that when the pump is connected to a system under pressure, vapors and/or gasses are not introduced to the system under pressure. For example, the pump can include cooling fluid pre-charged such that when the pump is connected to the cooling system, the pump can begin functioning without having to remove vapors and/or gasses from the pump.

As illustrated in FIG. 1, the pump can include compression release mechanism 114. As used herein, the term "compression release mechanism" can, for example, refer to a device which can provide pressure relief in response to compressive forces being placed on the fluid in the pump.

Compression release mechanism 114 can provide pressure relief in order to relieve compression forces generated on the fluid included in the pump in response to the pump being connected to a manifold. For example, when the pump is connected to a manifold of a computing device cooling system, first valve 102 and second valve 108 can generate compressive forces on the fluid included in the pump. The compressive forces can cause first valve 102 and second valve 108 to lock, preventing them from functioning properly.

Compression release mechanism 114 can allow for the compressive forces generated by first valve 102 and second valve 108 on the fluid in the pump to be relieved, allowing the pump to be connected to the manifold of the computing device cooling system. Compression release mechanism 114 can include an accumulator and/or a discharge pipe, as further described herein with respect to FIGS. 2A-2C and FIG. 3.

Figure 2A:
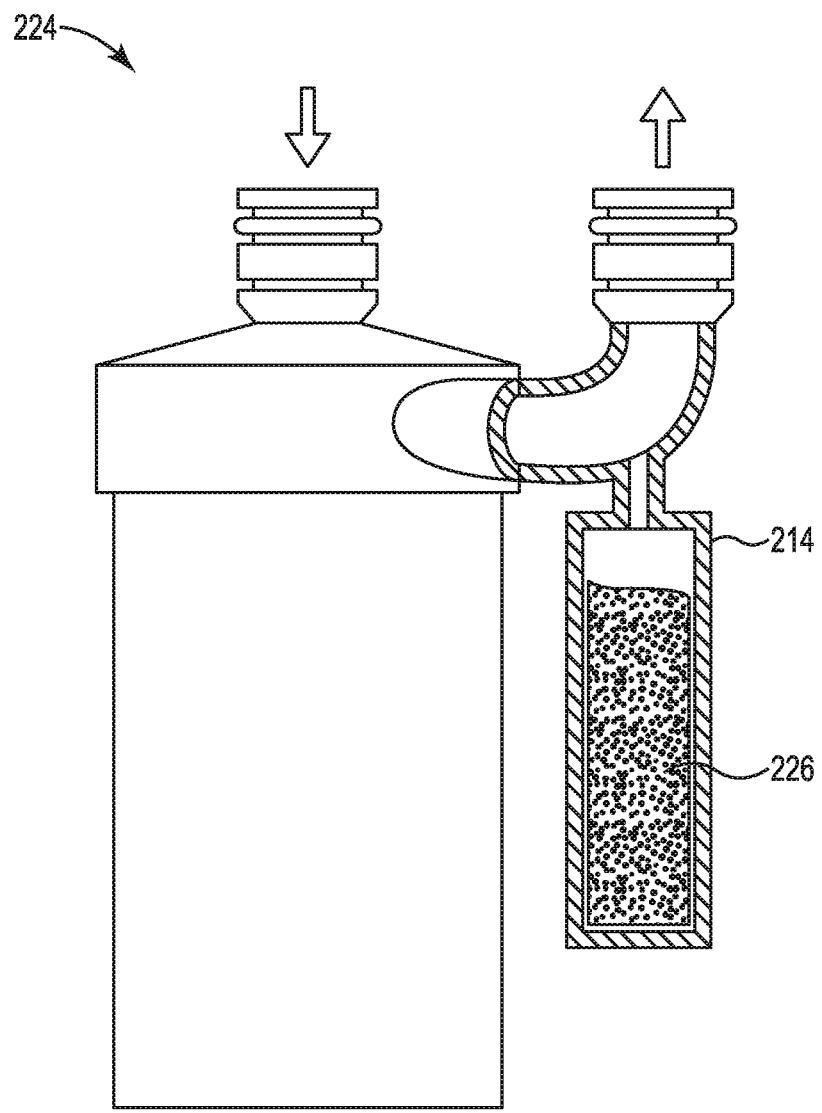
FIG. 2A illustrates a side view of an example of a pump with an accumulator consistent with the disclosure.

FIG. 2A illustrates a side view 224 of an example of a pump with an accumulator consistent with the disclosure. As illustrated in FIG. 2A, the pump can include a compression release mechanism 214.

Compression release mechanism 214 can be an accumulator. As used herein, the term "accumulator" can, for example, refer to a pressure storage reservoir in which a fluid is held under pressure that is applied by an external source. For example, the accumulator can store pressure that is applied to the fluid of the pump in response to the pump being connected to a manifold of a computing device.

The accumulator can include a closed cell foam core 226. As used herein, the term "closed cell foam core" can, for example, refer to a substance having closed cells including pockets of gas. For example, closed cell foam core 226 can include discrete pockets of gas surrounded by solid material.

Closed cell foam core 226 can compress to relieve compression forces generated on the fluid in the pump in response to the pump being connected to a manifold of a computing device cooling system. For example, when the pump is connected to the manifold of the computing device, compressive forces can be applied to the fluid in the pump. As the compressive forces are applied to the fluid as the pump is connected to the manifold, the fluid can enter compression release mechanism 214 and compress closed cell foam core 226. In other words, the fluid can compress closed cell foam core 226 in response to compressive forces generated as a result of the pump being connected to the manifold. The compression of closed cell foam core 226 can relieve the compressive forces, allowing the pump to be connected to the manifold.

Although not illustrated in FIG. 2A for clarity and so as not to obscure examples of the disclosure, closed cell foam core 226 can include a plunger. As used herein, the term "plunger" can, for example, refer to a piston located inside of compression release mechanism 214 that can interact with the fluid in the pump. In the orientation illustrated in FIG. 2A, the piston can be located on top of closed cell foam core 226 within compression release mechanism 214. For example, in response to compressive forces generated as a result of the pump being connected to the manifold, the fluid can contact the plunger, and the plunger can compress closed cell foam core 226, relieving the compressive forces and allowing the pump to be connected to the manifold.

Figure 2B:
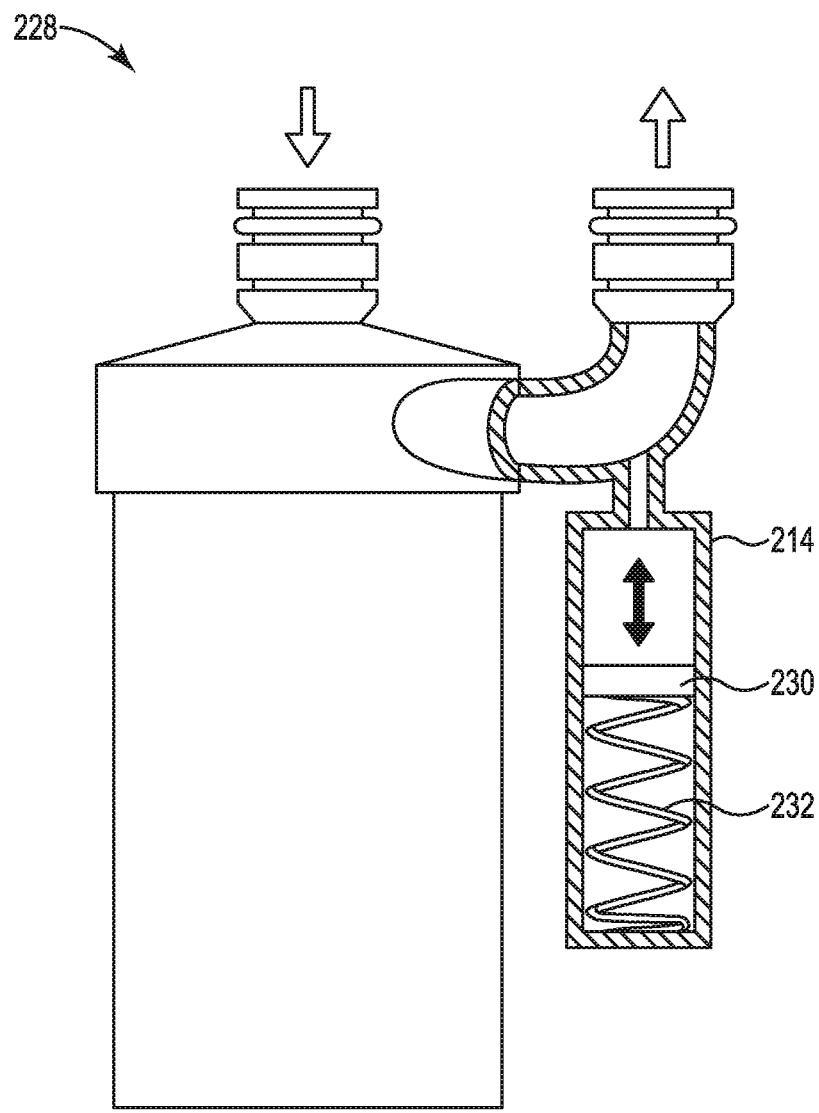
FIG. 2B illustrates a side view of an example of a pump with an accumulator consistent with the disclosure.

FIG. 2B illustrates a side view 228 of an example of a pump with an accumulator consistent with the disclosure. As illustrated in FIG. 2B, the pump can include a compression release mechanism 214.

Compression release mechanism 214 can be an accumulator. The accumulator can include a plunger 230 and a spring 232. As used herein, the term "spring" can, for example, refer to an elastic object that stores mechanical energy.

Spring 232 can compress to relieve compression forces generated on the fluid in the pump in response to the pump being connected to a manifold of a computing device cooling system. For example, when the pump is connected to the manifold of the computing device, compressive forces can be applied to the fluid in the pump. As the compressive forces are applied to the fluid as the pump is connected to the manifold, the fluid can enter compression release mechanism 214, contact plunger 230, and compress spring 232. In other words, the fluid can compress spring 232 in response to compressive forces generated as a result of the pump being connected to the manifold. The compression of spring 232 can relieve the compressive forces, allowing the pump to be connected to the manifold.

Figure 2C:
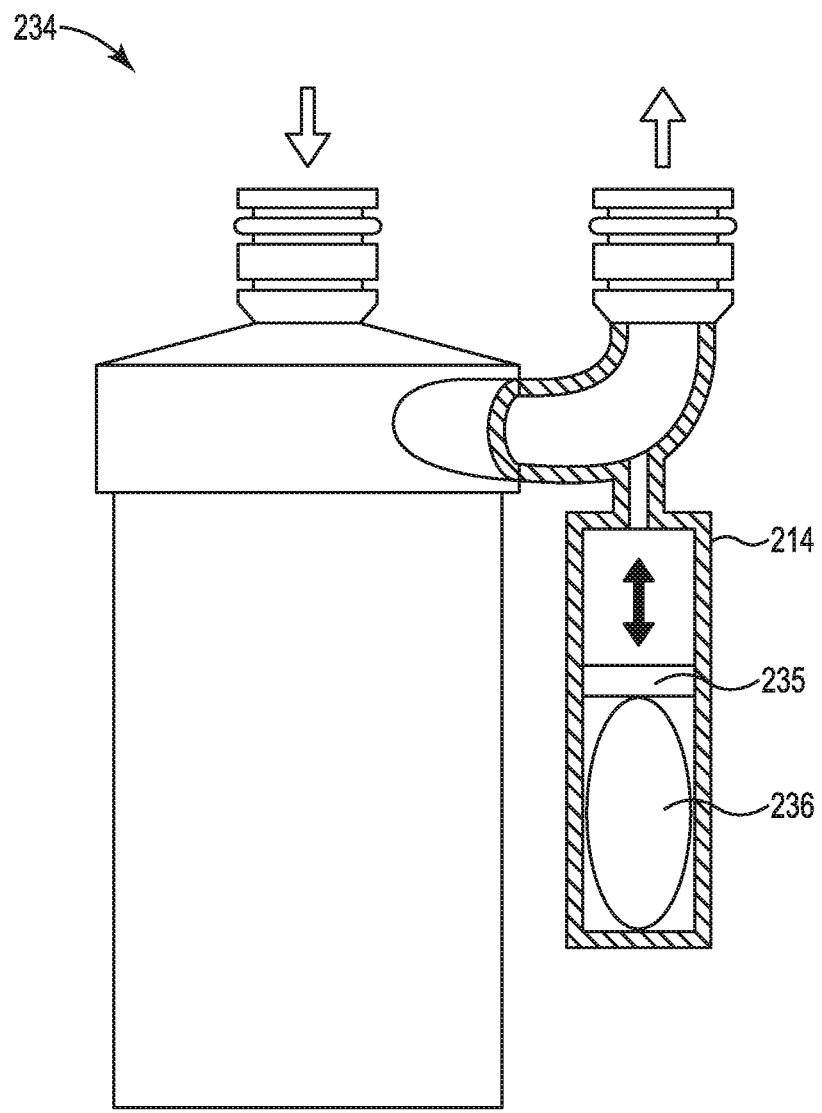
FIG. 2C illustrates a side view of an example of a pump with an accumulator consistent with the disclosure.

FIG. 2C illustrates a side view 234 of an example of a pump with an accumulator consistent with the disclosure. As illustrated in FIG. 2C, the pump can include a compression release mechanism 214.

Compression release mechanism 214 can be an accumulator. The accumulator can include a diaphragm 236. As used herein, the term "diaphragm" can, for example, refer to a flexible membrane that stores mechanical energy.

Diaphragm 236 can compress to relieve compression forces generated on the fluid in the pump in response to the pump being connected to a manifold of a computing device cooling system. For example, when the pump is connected to the manifold of the computing device, compressive forces can be applied to the fluid in the pump. As the compressive forces are applied to the fluid as the pump is connected to the manifold, the fluid can enter compression release mechanism 214, contact diaphragm 236, and compress diaphragm 236. In other words, the fluid can compress diaphragm 236 in response to compressive forces generated as a result of the pump being connected to the manifold. The compression of diaphragm 236 can relieve the compressive forces, allowing the pump to be connected to the manifold.

The accumulator can include a plunger 235. For example, as compressive forces are applied to the fluid in the pump as the pump is connected to the manifold, the fluid can enter compression release mechanism 214, contact plunger 235, and compress diaphragm 236. That is, the fluid can interact with plunger 235 in order to compress diaphragm 236.

Figure 3:
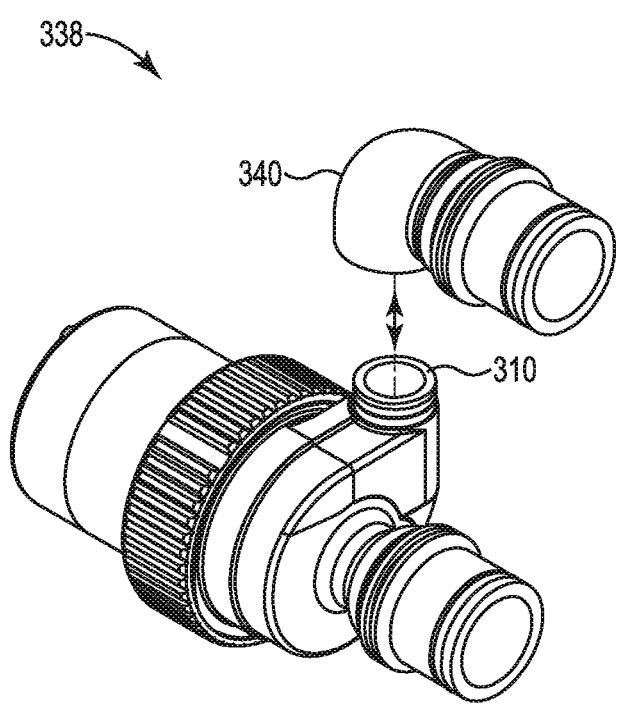
FIG. 3 illustrates a perspective view of an example of a pump with a discharge pipe consistent with the disclosure.

FIG. 3 illustrates a perspective view 338 of an example of a pump with a discharge pipe 340 consistent with the disclosure. As illustrated in FIG. 3, the pump can include a discharge pipe 340.

The compression release mechanism can be a discharge pipe 340. As used herein, the term "discharge pipe" can, for example, refer to a pipe connected to outlet 310 of the pump, where discharge pipe 340 can receive the fluid as the fluid exits the pump.

Discharge pipe 340 can be connected to outlet 310 of the pump. Discharge pipe 340 can be located between outlet 310 and the second valve (e.g., second valve 108, previously described in connection with FIG. 1). For example, discharge pipe 340 can receive the fluid as the fluid exits the pump, and provide the fluid to the second valve.

Discharge pipe 340 can slide linearly relative to the outlet 310 of the pump in response to the pump being connected to a manifold of the computing device cooling system. For example, in the orientation illustrated in FIG. 3, discharge pipe 340 can slide up and/or down relative to outlet 310. For example, when the pump is connected to the manifold of the computing device, compressive forces can be applied to the fluid in the pump. As the compressive forces are applied to the fluid as the pump is connected to the manifold, discharge pipe 340 can slide linearly and in an upwards direction (e.g., in the orientation illustrated in FIG. 3). In other words, the fluid can move into discharge pipe 340 to cause discharge pipe 340 to slide linearly in order to relieve compression forces generated as a result of the pump being connected to the manifold. The linear motion of discharge pipe 340 can relieve the compressive forces, allowing the pump to be connected to the manifold.

Figure 4:
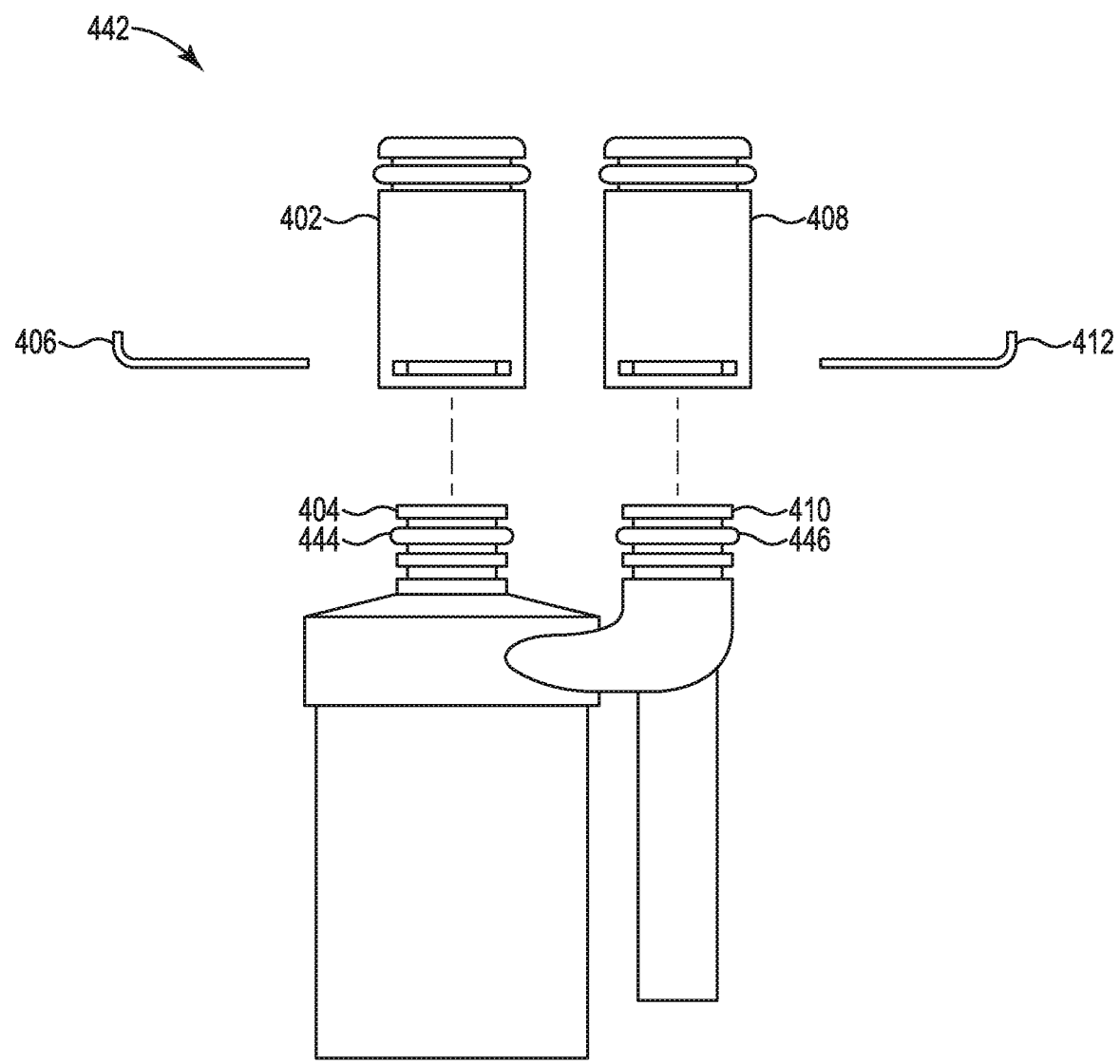
FIG. 4 illustrates a side view of an example of a pump consistent with the disclosure.

FIG. 4 illustrates a side view 442 of an example of a pump consistent with the disclosure. As illustrated in FIG. 4, the pump may include first valve 402, first clip 406, inlet 404 of the pump, second valve 408, second clip 412, outlet 410 of the pump, first o-ring 444, and second o-ring 446.

As previously described in connection with FIG. 1, the pump can include an inlet 404. First valve 402 can be connected to inlet 404 by first clip 406. As illustrated in FIG. 4, inlet 404 can include first o-ring 444. As used herein, the term "o-ring" can, for example, refer to a mechanical gasket. First o-ring 444 can be in the shape of a torus. First o-ring 444 can include dimensions such that first o-ring 444 of inlet 402 can cause a fluid tight seal between inlet 404 and first valve 402. As used herein, the term "fluid tight seal" can, for example, refer to a seal between two spaces such that fluid is not able to pass therebetween.

The dimensions of first o-ring 444 can cause the fluid tight seal between inlet 404 and first valve 402. For example, first o-ring 444 can prevent fluid from moving between first o-ring 444 and an inner wall of first valve 402. In other words, first o-ring 444 can prevent fluid from leaking out of the cooling system as the fluid moves from the cooling system of the computing device into the pump.

The pump can include an outlet 410. Second valve 408 can be connected to outlet 410 by second clip 412. As illustrated in FIG. 4, outlet 410 can include second o-ring 446. Second o-ring 446 can be in the shape of a torus. Second o-ring 446 can include dimensions such that second o-ring 446 of outlet 410 can cause a fluid tight seal between outlet 410 and second valve 408.

The dimensions of second o-ring 446 can cause the fluid tight seal between outlet 410 and second valve 408. For example, second o-ring 446 can prevent fluid from moving between second o-ring 446 and an inner wall of second valve 408. In other words, second o-ring 446 can prevent fluid from leaking out of the cooling system as the fluid moves from the pump and into the cooling system of the computing device.

Although first o-ring 444 and second o-ring 446 are described above as having a torus shape, examples of the disclosure are not so limited. For example, first o-ring 444 and second o-ring 446 can have any other shape, and/or can be the same and/or differently shaped from each other.

Figure 5:
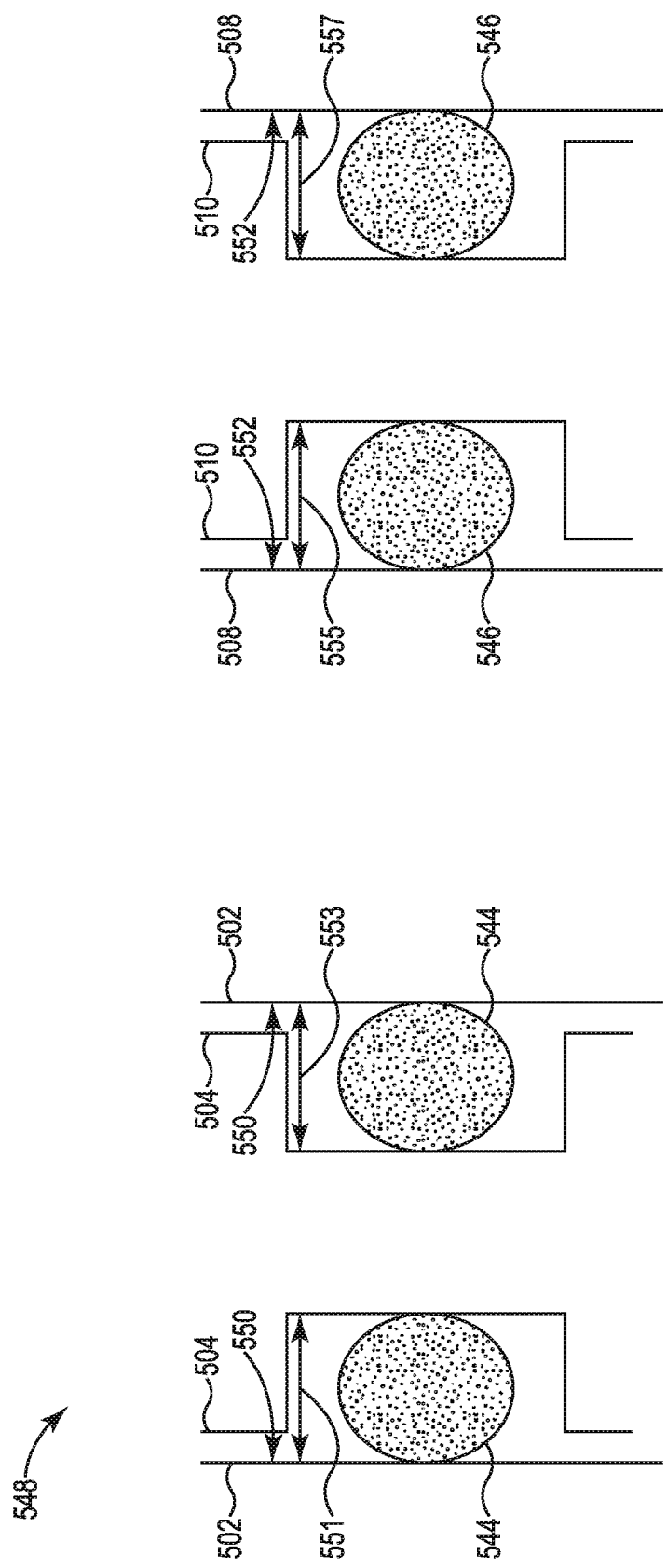
FIG. 5 illustrates a cut-away view of an example of valves and o-rings consistent with the disclosure.

FIG. 5 illustrates cut-away views 548 and 549 of an example of valves 502, 508 and o-rings 544, 546 consistent with the disclosure. As illustrated in FIG. 5, cut-away view 548 illustrates first valve 502, inlet 504 of the pump, and first o-ring 544. First valve 502 can include an inner surface 550. Cut-away view 549 illustrates second valve 508, outlet 510, and second o-ring 546. Second valve 508 can include an inner surface 552.

As illustrated in FIG. 5, cut-away view 548 can include a cut-away view of first valve 502 connected to inlet 504 of the pump. As previously described in connection with FIG. 4, first o-ring 544 can include dimensions such that first o-ring 544 of inlet 504 can cause a fluid tight seal between inlet 504 and first valve 502.

The dimensions of first o-ring 544 can be such that first o-ring 544 can cause the fluid tight seal between inlet 504 and first valve 502 based on first o-ring 544 being compressed by inner surface 550 of first valve 502. For example, when first valve 502 is connected with inlet 504, a dimension (e.g., a diameter) of first o-ring 544 may be larger than spaces 551 and 553 between a groove in which first o-ring 544 sits and inner surface 550 of first valve 502. As a result, first o-ring 544 can be compressed by inner surface 550. The compressed first o-ring 544 can result in a fluid tight seal between inlet 504 and first valve 502.

Although cut-away view 548 is illustrated in FIG. 5 as having equal spacing between the left and right sides of first valve 502 and inlet 504 (e.g., as oriented in FIG. 5), examples of the disclosure are not so limited. For example, first valve 502 may be connected to inlet 504 in such a way that space 551 between a groove in which first o-ring 544 sits and inner surface 550 of first valve 502 may be smaller than space 553 between a groove in which first o-ring 544 sits and inner surface 550 of first valve 502. Space 551 and space 553 being different lengths may occur as a result of misalignment of inlet 504 and first valve 502 when first valve 502 is connected to inlet 504. As a result of the misalignment, the portion of first o-ring 544 located in space 551 may be compressed more than the portion of first o-ring 544 located in space 553. However, first o-ring 544 can maintain the fluid tight seal between inlet 504 and first valve 502 based on the un-compressed diameter of first o-ring 544 being larger than a fit tolerance between first valve 502 and inlet 504.

Cut-away view 549 can include a cut-away view of second valve 508 connected to outlet 510 of the pump. As previously described in connection with FIG. 4, second o-ring 546 can include dimensions such that second o-ring 546 of outlet 510 can cause a fluid tight seal between outlet 510 and second valve 508.

The dimensions of second o-ring 546 can be such that second o-ring 546 can cause the fluid tight seal between outlet 510 and second valve 508 based on second o-ring 546 being compressed by inner surface 552 of second valve 508. For example, when second valve 508 is connected with outlet 510, a dimension (e.g., a diameter) of second o-ring 546 may be larger than spaces 555 and 557 between a groove in which second o-ring 546 sits and inner surface 552 of second valve 508. As a result, second o-ring 546 can be compressed by inner surface 552. The compressed second o-ring 546 can result in a fluid tight seal between outlet 510 and second valve 508.

Although cut-away view 549 is illustrated in FIG. 5 as having equal spacing between the left and right sides of second valve 508 and outlet 510 (e.g., as oriented in FIG. 5), examples of the disclosure are not so limited. For example, second valve 508 may be connected to outlet 510 in such a way that space 555 between a groove in which second o-ring 546 sits and inner surface 552 of second valve 508 may be smaller than space 557 between a groove in which second o-ring 546 sits and inner surface 550 of first valve 502 (e.g., and/or vice versa). Space 555 and space 557 being different lengths may occur as a result of misalignment of outlet 510 and second valve 508 when second valve 508 is connected to outlet 510. As a result of the misalignment, the portion of second o-ring 546 located in space 555 may be compressed more than the portion of second o-ring 546 located in space 557. However, second o-ring 546 can maintain the fluid tight seal between outlet 510 and second valve 508 based on the un-compressed diameter of second o-ring 546 being larger than a fit tolerance between second valve 508 and outlet 510.

Figure 6:
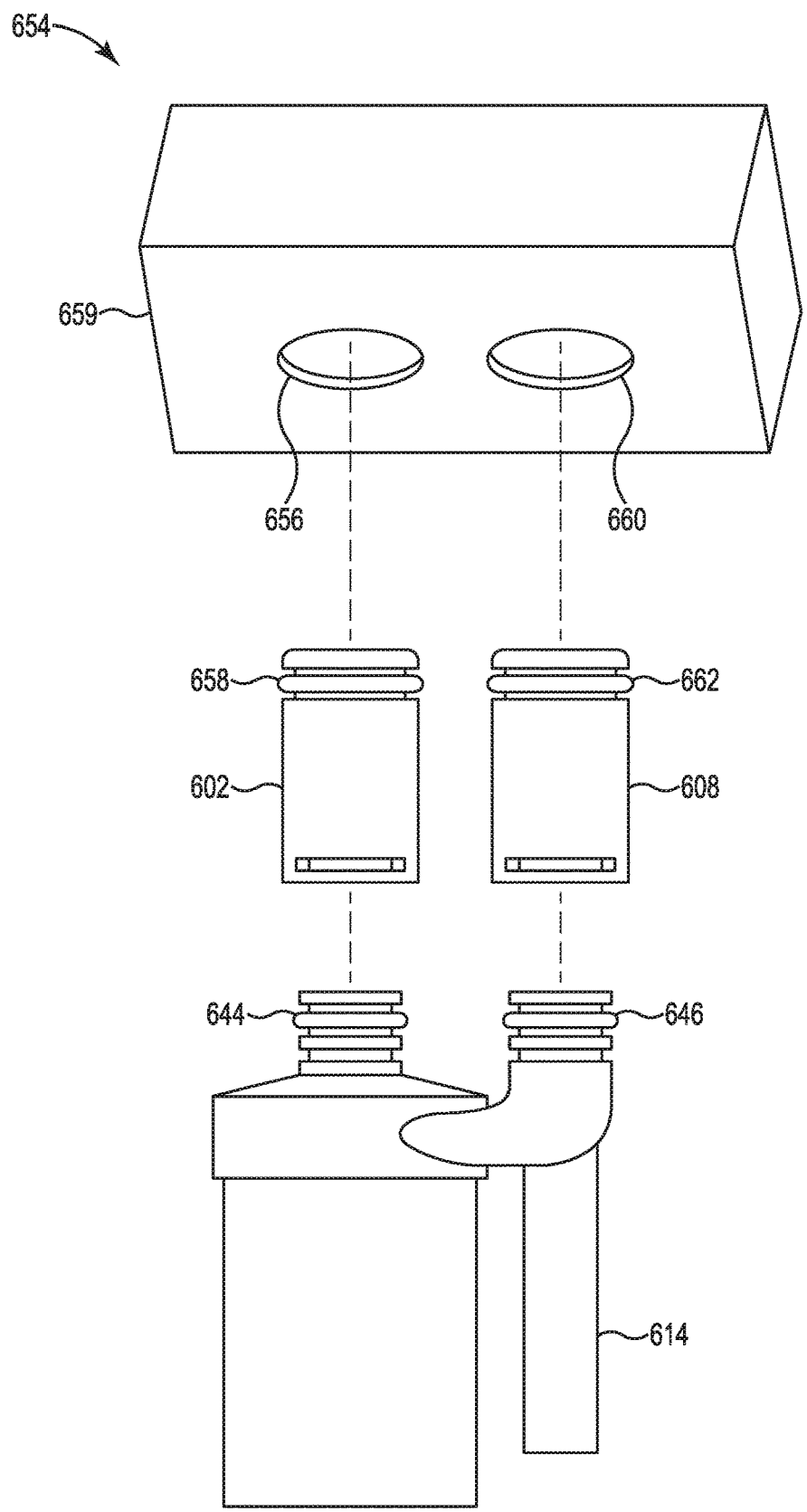
FIG. 6 illustrates a perspective view of an example of a pump and a manifold consistent with the disclosure.

FIG. 6 illustrates a perspective view 654 of an example of a pump and a manifold 659 consistent with the disclosure. As illustrated in FIG. 6, the pump can include first valve 602, first o-ring 644, second valve 608, second o-ring 646, and compression release mechanism 614. First valve 602 can include o-ring 658 of first valve 602. Second valve 608 can include o-ring 662 of second valve 608. Manifold 659 can include an outlet 656 of manifold 659 and an inlet 660 of manifold 659.

As previously described in connection with FIG. 1, the pump can include an inlet and an outlet. The inlet of the pump can include first o-ring 644, and the inlet of the pump can be connected to first valve 602, where first o-ring 644 can include dimensions such that o-ring 644 provides a fluid tight seal between the inlet of the pump and first valve 602. The outlet of the pump can include second o-ring 646, and the outlet of the pump can be connected to second valve 608, where second o-ring 646 can include dimensions such that o-ring 646 provides a fluid tight seal between the outlet of the pump and second valve 608.

Manifold 659 can include an outlet 656 and an inlet 660. As used herein, the term "manifold" can, for example, refer to a device to collect and/or distribute fluid. For example, manifold 659 can be a manifold of a computing device cooling system. Manifold 659 can collect and/or distribute cooling fluid to and/or from components of the computing device, as well as to and/or from the pump.

Outlet 656 of manifold 659 can be connected to first valve 602 such that cooling fluid from the computing system is supplied to the pump via first valve 602. For example, after cooling fluid has interacted with components of the computing system to cool the components, the cooling fluid can be directed to the pump via first valve 602.

First valve 602 can include o-ring 658 of first valve 602. O-ring 658 of first valve 602 can provide a fluid tight seal between first valve 602 and manifold 659 based on o-ring 658 being compressed by an inner surface of manifold 659. For example, although not shown in FIG. 5 for clarity and so as not to obscure examples of the disclosure, an inner surface of outlet 656 of manifold 659 can compress o-ring 658 when first valve 602 is connected to outlet 656 of manifold 659, providing a fluid tight seal between first valve 602 and manifold 659.

Inlet 660 of manifold 659 can be connected to second valve 608 such that cooling fluid from the pump is supplied to the components of the computing system via second valve 608. For example, after cooling fluid has been pumped through the pump, the cooling fluid can be directed toward the components of the computing system to cool the components via second valve 608.

Second valve 608 can include o-ring 662 of second valve 608. O-ring 662 of second valve 608 can provide a fluid tight seal between second valve 608 and manifold 659 based on o-ring 662 being compressed by an inner surface of manifold 659. For example, although not shown in FIG. 5 for clarity and so as not to obscure examples of the disclosure, an inner surface of inlet 660 of manifold 659 can compress o-ring 662 when second valve 608 is connected to inlet 660 of manifold 659, providing a fluid tight seal between second valve 608 and manifold 659.

As previously described in connection with FIGS. 2A-2C and FIG. 3, the pump can include compression release mechanism 614. Compression release mechanism 614 can relieve compression forces generated on the cooling fluid in the pump in response to the pump being connected to manifold 659. In some examples, compression release mechanism 614 can include an accumulator utilizing a closed cell foam core, a plunger and spring, and/or a diaphragm, among other types of accumulators. In some examples, compression release mechanism 614 can include a discharge pipe.

Pumps with pre-charged fluid, according to the disclosure, can allow for pumps of a computing device cooling system to be serviced and/or replaced without depressurizing the cooling system of the computing device. Utilizing a compression release mechanism, the pumps may be connected to the computing device cooling system while the fluid of the pump is pressurized. The dimensions of various o-rings of the pump can allow for a fluid tight seal of the cooling fluid, even if misalignment occurs while connecting the pumps to the computing device cooling system and/or connecting components of the pumps together.

In the foregoing detailed description of the disclosure, reference is made to the accompanying drawings that form a part hereof, and in which is shown by way of illustration how examples of the disclosure may be practiced. These examples are described in sufficient detail to enable those of ordinary skill in the art to practice the examples of this disclosure, and it is to be understood that other examples may be utilized and that process, electrical, and/or structural changes may be made without departing from the scope of the disclosure.

The figures herein follow a numbering convention in which the first digit corresponds to the drawing figure number and the remaining digits identify an element or component in the drawing. Similar elements or components between different figures may be identified by the use of similar digits. For example, 102 may reference element "02" in FIG. 1, and a similar element may be referenced as 402 in FIG. 4. Elements shown in the various figures herein can be added, exchanged, and/or eliminated so as to provide a plurality of additional examples of the disclosure. In addition, the proportion and the relative scale of the elements provided in the figures are intended to illustrate the examples of the disclosure, and should not be taken in a limiting sense. As used herein, "a plurality of" an element and/or feature can refer to more than one of such elements and/or features.

What is claimed:

1. A pump, comprising:
    a first valve connected to an inlet of the pump by a first clip;
    a second valve connected to an outlet of the pump by a second clip; and
    a compression release mechanism to relieve compression forces generated on a fluid included in the pump in response to the pump being connected to a manifold, wherein the compression release mechanism comprises a discharge pipe connected to the outlet of the pump, wherein the discharge pipe slides linearly relative to the outlet of the pump to relieve the compression forces generated on the fluid in response to the pump being connected to the manifold;

wherein the pump is pre-charged with the fluid such that when the pump is connected to a system under pressure, vapors and/or gasses are not introduced into the system under pressure.

2. The pump of claim 1, wherein the compression release mechanism is an accumulator.

3. The pump of claim 2, wherein the accumulator includes a closed cell foam core that compresses to relieve the compression forces generated on the fluid in response to the pump being connected to the manifold.

4. The pump of claim 2, wherein the accumulator includes a spring and a plunger, wherein the plunger compresses the spring to relieve the compression forces generated on the fluid in response to the pump being connected to the manifold.

5. The pump of claim 2, wherein the accumulator includes a diaphragm, wherein the diaphragm compresses to relieve the compression forces generated on the fluid in response to the pump being connected to the manifold.

6. The pump of claim 1, wherein:
the inlet of the pump includes a first o-ring having dimensions such that the inlet o-ring causes a fluid tight seal between the inlet and the first valve; and
the outlet of the pump includes a second o-ring having dimensions such that the outlet o-ring causes a fluid tight seal between the outlet and the second valve.

7. A system, comprising:
a pump having an inlet and an outlet;
a first valve connected to the inlet of the pump by a first clip, wherein the inlet of the pump includes an o-ring having dimensions such that the inlet o-ring causes a fluid tight seal between the inlet and the first valve;
a second valve connected to the outlet of the pump by a second clip, wherein the outlet of the pump includes an o-ring having dimensions such that the outlet o-ring causes a fluid tight seal between the outlet and the second valve; and
a compression release mechanism to relieve compression forces generated on a fluid included in the pump in response to the pump being connected to a manifold, wherein the compression release mechanism includes a discharge pipe connected to the outlet of the pump, wherein the discharge pipe slides linearly relative to the outlet of the pump to relieve the compression forces generated on the fluid in response to the pump being connected to the manifold;
wherein the pump is pre-charged with fluid such that, in response to the pump being connected to the manifold:
the pump supplies the pre-charged fluid from the outlet of the pump to the manifold;
the pump receives the fluid from the manifold via the inlet of the pump; and
vapors and/or gasses are not introduced into the manifold.

8. The system of claim 7, wherein the first valve includes a slot and the inlet of the pump includes a groove such that the first clip is received by the groove in the inlet of the pump via the slot of the first valve to secure the first valve to the inlet of the pump.

9. The system of claim 7, wherein the second valve includes a slot and the inlet of the pump includes a groove such that the second clip is received by the groove in the outlet of the pump via the slot of the second valve to secure the second valve to the outlet of the pump.

10. The system of claim 7, wherein:
the o-ring included in the inlet of the pump causes the fluid tight seal between the inlet and the first valve based on the inlet o-ring being compressed by an inner surface of the first valve; and
the o-ring included in the outlet of the pump causes the fluid tight seal between the outlet and the second valve based on the outlet o-ring being compressed by an inner surface of the second valve.

11. The system of claim 7, wherein:
the first valve includes an o-ring such that the o-ring of the first valve causes a fluid tight seal between the first valve and the manifold based on the o-ring of the first valve being compressed by an inner surface of the manifold; and
the second valve includes an o-ring such that the o-ring of the second valve causes a fluid tight seal between the second valve and the manifold based on the o-ring of the second valve being compressed by an inner surface of the manifold.

12. The system of claim 7, wherein the compression release mechanism is an accumulator having a compression mechanism.

13. The system of claim 12, wherein the compression mechanism comprises a closed cell foam core.

14. A computing device, comprising:
a pump having an inlet and an outlet;
a first valve connected to the inlet of the pump, wherein the inlet of the pump includes an o-ring having dimensions such that the inlet o-ring causes a fluid tight seal between the inlet and the first valve;
a second valve connected to the outlet of the pump, wherein the outlet of the pump includes an o-ring having dimensions such that the outlet o-ring causes a fluid tight seal between the outlet and the second valve;
a manifold including an outlet and an inlet, wherein:
the outlet of the manifold is connected to the first valve such that cooling fluid from the computing device is supplied to the pump via the first valve; and
the inlet of the manifold is connected to the second valve such that the cooling fluid is supplied from the pump to the computing device via the second valve; and
a compression release mechanism to relieve compression forces generated on the cooling fluid in the pump in response to the pump being connected to the manifold, wherein the compression release mechanism includes a discharge pipe located between the outlet of the pump and the second valve, wherein the discharge pipe slides linearly relative to the outlet of the pump to relieve the compression forces generated on the cooling fluid in response to the pump being connected to the manifold;
wherein the cooling fluid is supplied from the pump to the computing device via the manifold to cool components of the computing device.

15. The computing device of claim 14, wherein the compression release mechanism includes an accumulator having a compression mechanism that compresses to relieve the compression forces generated on the cooling fluid in response to the pump being connected to the manifold.

16. The computing device of claim 15, wherein the compression mechanism comprises a closed cell foam core.

17. The computing device of claim 15, wherein:
the accumulator includes a spring and a plunger and
the compression mechanism comprises the spring.

* * * * *